(12) United States Patent
Byun

(10) Patent No.: US 6,670,205 B1
(45) Date of Patent: Dec. 30, 2003

(54) METHOD OF FABRICATING IMAGE SENSOR EQUIPPED WITH LENS

(75) Inventor: Seong-cheol Byun, Anyang-shi (KR)

(73) Assignee: Hynix Semiconductor Inc, Gyunggi-Do (KR)

(*) Notice: Subject to any disclaimer, the term of this patent is extended or adjusted under 35 U.S.C. 154(b) by 0 days.

(21) Appl. No.: 10/365,987

(22) Filed: Feb. 13, 2003

(30) Foreign Application Priority Data

Sep. 18, 2002 (KR) .................... 10-2002-0057071

(51) Int. Cl.⁷ ............................................. H01L 21/00
(52) U.S. Cl. ........................ 438/22; 438/48; 438/29; 438/30; 438/60; 438/69; 438/70; 438/75; 438/144
(58) Field of Search ............................ 438/48, 22, 23, 438/24, 25, 26, 29, 30, 42, 46, 59, 60, 69, 70, 75, 144

(56) References Cited

U.S. PATENT DOCUMENTS

| | | | | |
|---|---|---|---|---|
| 4,321,628 A | * | 3/1982 | Crean | 358/497 |
| 5,052,783 A | * | 10/1991 | Hamada | 349/5 |
| 5,719,706 A | * | 2/1998 | Masumoto et al. | 359/622 |
| 5,751,387 A | * | 5/1998 | Iigahama et al. | 349/95 |
| 5,986,297 A | | 11/1999 | Guidash et al. | |
| 6,014,232 A | * | 1/2000 | Clarke | 358/482 |
| 6,180,969 B1 | | 1/2001 | Yang et al. | |
| 6,369,417 B1 | | 4/2002 | Lee | |

\* cited by examiner

*Primary Examiner*—Amir Zarabian
*Assistant Examiner*—Khanh B. Duong
(74) *Attorney, Agent, or Firm*—Marshall, Gerstein & Borun LLP

(57) ABSTRACT

Methods of fabricating an image sensor equipped with a lens are disclosed. The disclosed methods can attach a lens directly onto a device without fabricating a separate lens module in a fabrication process of an image sensor device by forming a concave groove on the bottom surface of the lens and coupling the device and the lens by alignment marks after forming a metal convex portion around a pixel array and forming a lens from a mobile material in the final step of device fabrication prior to performing a packaging process.

6 Claims, 4 Drawing Sheets

(I)

(II)

(III)

METHOD OF FABRICATING IMAGE SENSOR EQUIPPED WITH LENS

BACKGROUND

1. Technical Field

A method of fabricating an image sensor is disclosed wherein the image sensor is equipped with a lens which can form an image sensor device during the fabrication process of a semiconductor device. The method attaches a lens directly onto the device without assembling a separate lens module.

2. Description of the Related Art

An image sensor is an apparatus which senses information of a subject and converts it into an electrical video signal and is divided into a pickup tube and a solid state image sensor. The former includes a vidicon and a plumbicon, while the latter includes a Complementary Metal Oxide Semiconductor (hereinafter, 'CMOS'), a Charged Coupled Device (hereinafter, 'CCD'). Among them, the image sensor used as the solid state image sensor is generally used by coupling a lens to a semiconductor chip package equipped with a semiconductor chip for an image sensor. Semiconductor chip packages for an image sensor are broadly classified into those for CMOS and those for CCD according to the semiconductor device.

For a CMOS image sensor, a CMOS and pixel formation process is carried out and finally a metal wire is formed. Then, a color filter formation process is performed in order to embody a color sensor and a micro lens is formed on an upper portion of an individual pixel on an upper portion of a device in order to increase a light gathering power. Next, the device is packaged, and then the packaged device is placed onto a plastic circuit board (hereinafter, 'PCB') and is coupled to a lens module.

Such a method of fabricating an image sensor in the prior art has a problem in that, since the device and the lens module are separate, the focal distance between a pixel array of the device and the lens module needs to be corrected, the shape of the lens module has to be changed according to the position of the pixel array in the device and the size of the lens module has to be changed according to the size of the package.

Additionally, the upper portion of the device can be contaminated by impurities during packaging of the device, defects caused from separation can be generated during assembly of the packaged device and the lens module, and the size of the end product is larger because of the overall size of the module.

Moreover, in the packaging process of the device as well as wafer processing, yield checking and wafer back surface grinding, if impurities remain on the pixel array, defects can be generated. Further, impurities in the package or silicon powders generated on the periphery of the device during cutting can penetrate into the pixel array causing defects.

SUMMARY OF THE DISCLOSURE

To solve the above problems, methods of fabricating an image sensor are disclosed wherin the image sensor is equipped with a lens which can attach a lens directly on a device without fabricating a separate lens module in a fabrication process of an image sensor device by forming a concave groove on the bottom surface of the lens and coupling the device and the lens by alignment marks after forming a metal convex portion around a pixel array and forming a lens from a mobile material in the final step of device fabrication prior to performing a packaging process.

One disclosed method of fabricating an image sensor equipped with a lens, wherein a pixel array portion and a CMOS logic portion are integrated into one chip, comprises forming a metal wire and depositing an insulating film and a top metallic layer on a substrate; remaining the top metallic layer around a pixel array and depositing protection films on the top metallic layer; exposing the top metallic layer between the protection films by carrying out a color filter formation process and then a masking process opening a pad metal terminal; depositing a titanium film and a metallic film onto the upper portion of the top metallic layer; opening the portion in which a metal convex portion is to be formed and forming the metal convex portion on the upper portion of the metallic film using an electroplating method; removing the metallic film and the titanium film around the metal convex portion; forming a lens to be aligned with the pixel array of a device; and coupling the device and the lens using alignment marks.

In an embodiment, the titanium film and the metallic film are deposited by a sputtering method or electroplating method.

Preferably, the metallic film and the metal convex portion are made of Au, Ag or Cu. The metal convex portion forming step using the electroplating method is performed using a sulfite electrolyte solution. The top metallic layer remaining around the pixel array can be formed in a closed-type, a streamlined-type or a straight-type. The lens has a groove which can be integrated with the metal convex portion.

BRIEF DESCRIPTION OF THE DRAWINGS

The above features and advantages of the disclosed methods will become more apparent from the following detailed description when taken in conjunction with the accompanying drawings, wherein.

DETAILED DESCRIPTION OF THE PRESENTLY PREFERRED EMBODIMENTS

A preferred embodiment will now be described with reference to the accompanying drawings. The parameters defined in the description such as a detailed construction and elements of a circuit are provided to assist in understanding the invention. Thus, it is apparent that the disclosed methods can be carried out without those defined parameters.

FIGS. 1a to 1g are views showing a disclosed method of fabricating a CMOS image sensor equipped with a lens.

Figure 1A:
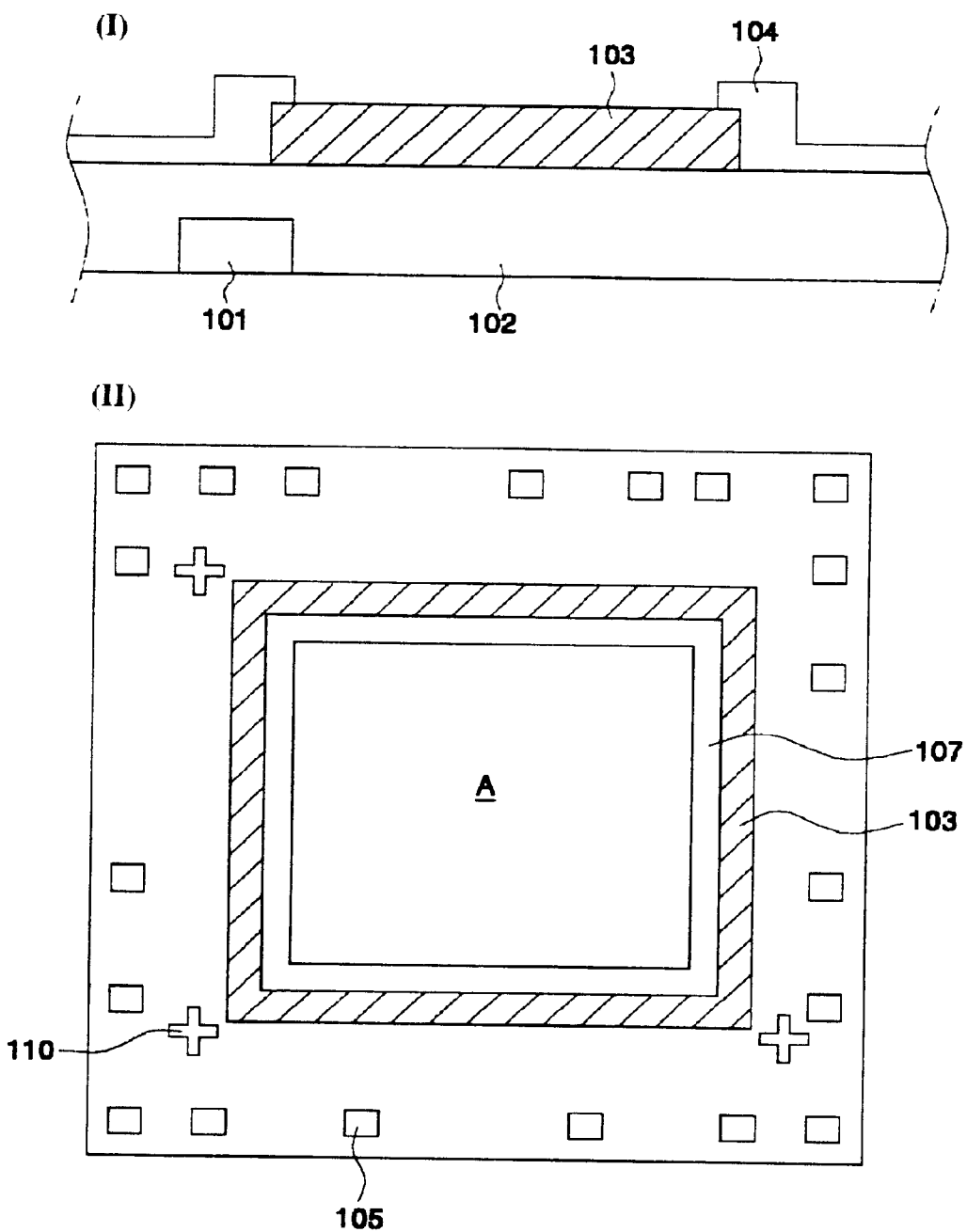
FIGS. 1a to 1g are views showing a disclosed method of fabricating a CMOS image sensor equipped with a lens.

Referring to part I of FIG. 1a, for a CMOS image sensor, a CMOS and pixel formation process is carried out and a metal wire 101 is formed on a substrate. Then, to embody a color sensor, intermetallic insulating film 102 is deposited without performing a color filter formation process unlike the prior art. Next, a masking process opening only a bonding pad metal terminal is carried out and then an etching process is carried out. Thereafter, a top metallic layer 103 is deposited at a thickness of about 8000 Å and then a masking process is carried out.

At this time, referring to part II of FIG. 1a, a bonding pad metal terminal 105 is made to have a remaining metallic pattern. And the top metallic layer 103 is patterned to have a width of more than 60 µm remaining on the periphery of a pixel array portion A. At this time, the metallic band of the top metallic layer may be continuous, which is a closed-type, or may be discontinuous. Further, it has to be patterned so that an alignment mark groove can be formed.

In addition, the top metallic layer remaining around the pixel array is formed in a closed-type as well as a streamlined-type or straight-type.

Subsequently, to deposit a protection film and embody a color sensor by a general process, a color filter formation process is carried out. Thereafter, a micro lens is formed in an individual pixel of the upper portion of a device in order to increase the light gathering capability. Then, a masking process opening the pad metal terminal 105 is carried out. At this time, the masking process has to be carried out in such a manner that the top metallic layer 103 can be exposed between protection films 104. The opened portion of the top metallic has a width of more than 20 µm.

Figure 1B:
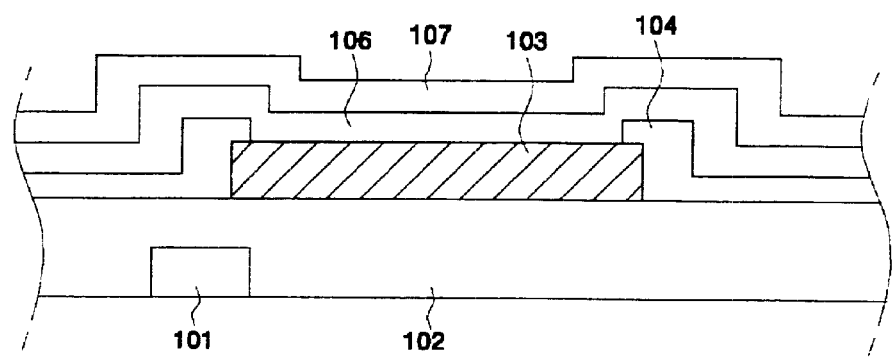

Referring to FIG. 1b, to increase the adhesive force between the top metallic layer 103 and a metal convex portion, a titanium film 106 is deposited at a thickness of about 4000 Å. Thereafter, a metallic film 107 is deposited thereon to form a metal convex portion. At this time, the metallic film 107 is formed wherein gold (Au) is deposited onto the front surface of a wafer at a thickness of 1000 Å by a sputtering method or electroplating method.

In an embodiment, the metallic film and the metal convex portion can be made of Au as well as Ag or Cu.

Figure 1C:
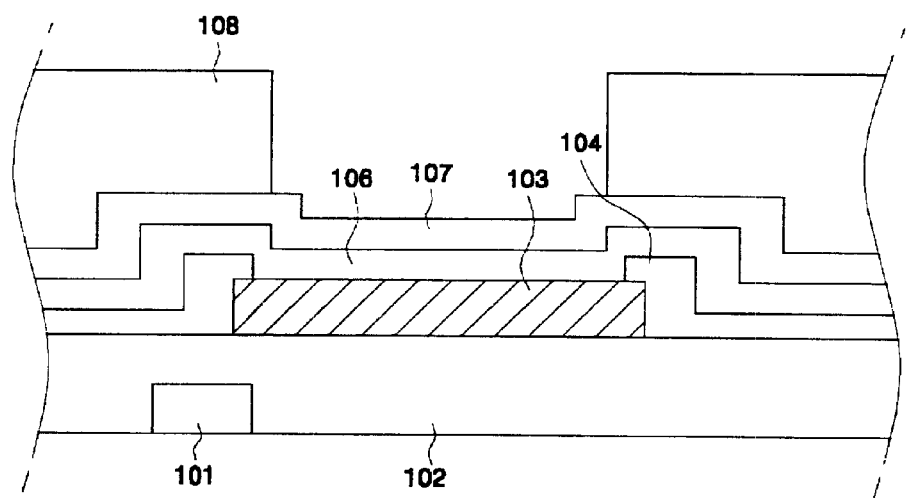

Referring to FIG. 1c, a photoresist pattern 108 is formed for opening only the portion on which the metal convex portion is to be formed. At this time, the opened portion is more than 30 µm.

Figure 1D:
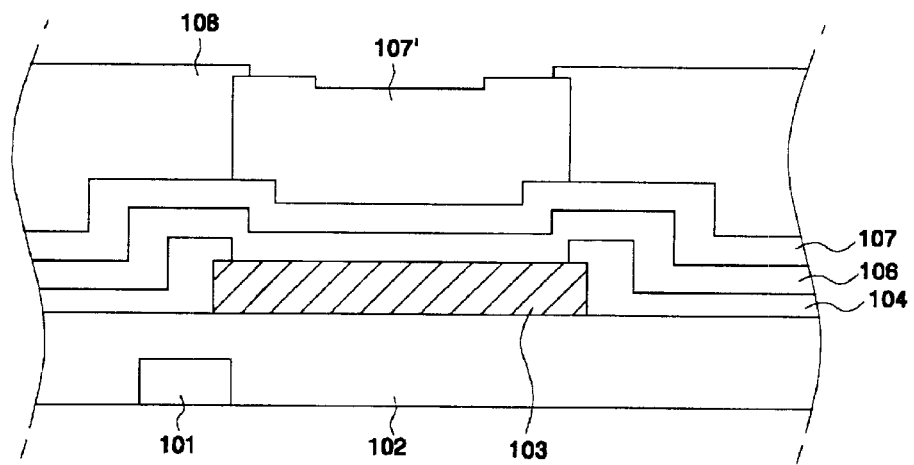

Referring to FIG. 1d, the wafer is soaked in sulfite used as an electrolyte solution and the wafer is connected to a cathode and the electrolyte solution is connected to an anode. This leads to a chemical reaction and thus a metal convex portion 107' grows from the metallic film 107. At this time, the metal convex portion 107' is formed such that the plated aurum cannot be projected from the photoresist pattern 108.

Figure 1E:
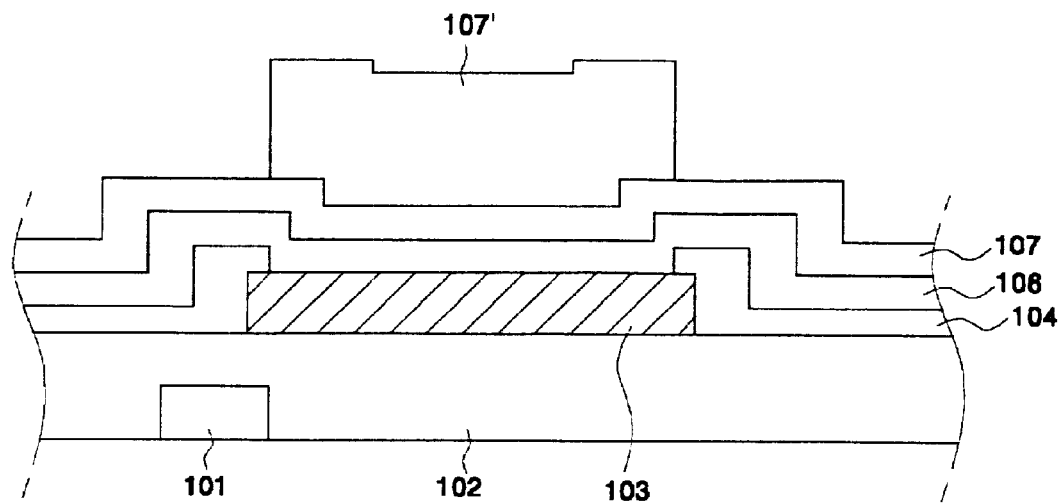

Referring to FIG. 1e, the photoresist pattern 108 is removed.

Figure 1F:
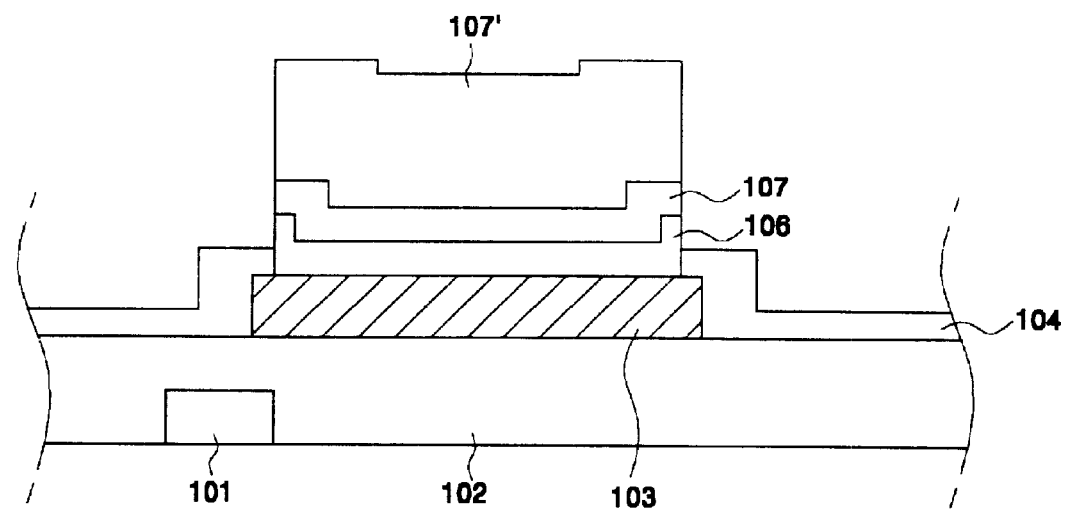

Referring to FIG. 1f, the metallic film 107 and the titanium layer 106 around the plated metal convex portion 107' made of aurum are removed.

Figure 1G:
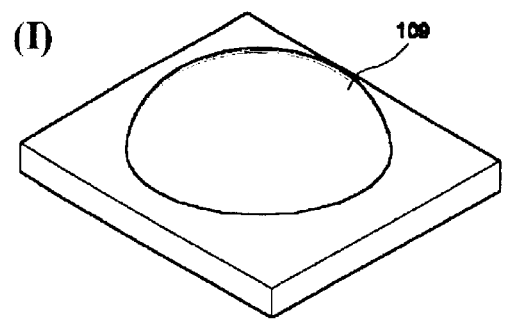
Figure 1G:
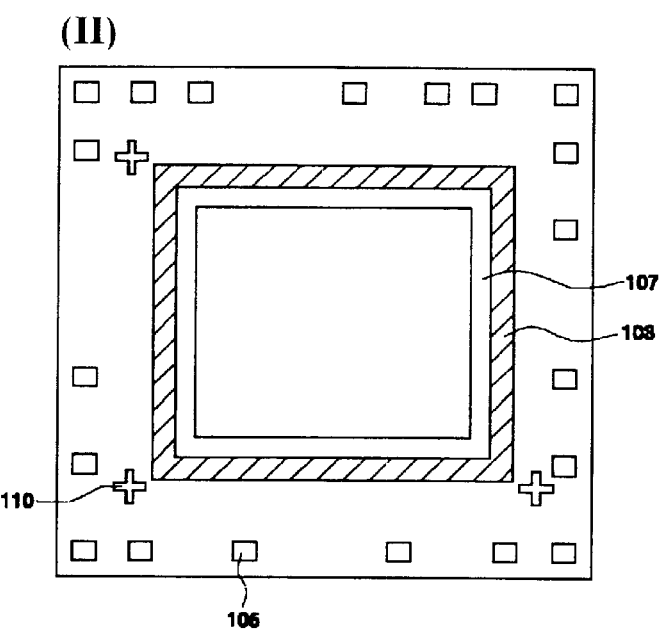
Figure 1G:
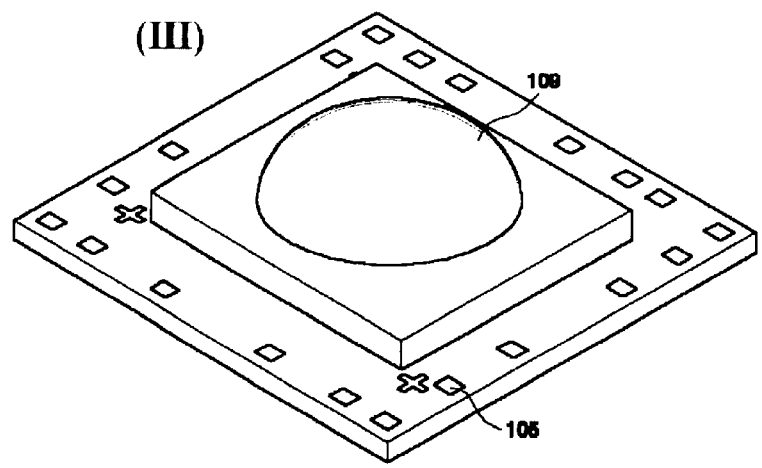

Referring to FIG. 1g, part I of FIG. 1g shows a lens portion, in which the bottom surface is square and the upper portion serves as a lens. At this time, the diameter is determined depending on the size of the pixel array, the radius of the curvature is determined depending on the focal distance, and the thickness of the square surface below the lens 109 is also determined depending on the focal distance. Part II of FIG. 1g shows an alignment position of the device formed on an upper portion. If making the metal convex portion as a closed-type, the bottom surface of the lens 109 also has to be formed as a closed-type and the groove of the alignment mark also has to be formed on the bottom surface of the lens 109.

Part III of FIG. 1g is a view showing an image sensor equipped with a lens fabricated by coupling the lens portion 109 and the device. The coupling can be easily performed by coinciding alignment marks 110 when the lens is placed on the device. Also, the bottom surface of the lens may be engraved as much as the pixel array so that the pixel array does not contact the lens portion. If the lens is attached after the back surface of the wafer has been grinded, this can reduce costs and improve process stability.

As explained above, the disclosed methods can prevent defects caused by impurities generated in a device packaging process since the lens is directly attached to a device without fabricating a separate lens module in a fabrication process of an image sensor device by forming a concave groove on the bottom surface of the lens and coupling the device and the lens by alignment marks after forming a metal convex portion around a pixel array and forming a lens from a mobile material in the final step of device fabrication prior to performing a packaging process. Also, the disclosed methods can completely prevent defects caused by separation between the focus of the lens module and the focus of the device.

Additionally, the overall size of the module can be reduced by packaging the device and the lens in the same chip.

What is claimed is:

1. A method of fabricating an image sensor equipped with a lens, wherein a pixel array portion and a CMOS logic portion are integrated in one chip, the method comprising:

forming a metal wire and depositing an insulating film and a top metallic layer on a substrate;

remaining the top metallic layer around a pixel array and depositing protection films on the top metallic layer;

exposing the top metallic layer between the protection films by carrying out a color filter formation process and then a masking process opening a pad metal terminal;

depositing a titanium film and a metallic film onto the upper portion of the top metallic layer;

opening a portion in which a metal convex portion is to be formed and forming the metal convex portion on the upper portion of the metallic film using an electroplating method;

removing the metallic film and the titanium film around the metal convex portion;

forming a lens to be aligned with the pixel array of a device; and coupling the device and the lens using alignment marks.

2. The method of claim 1, wherein the titanium film and the metallic film are deposited by a sputtering method or electroplating method.

3. The method of claim 1, wherein the metallic film and the metal convex portion are made of materials selected from the group consisting of Au, Ag or Cu.

4. The method of claim 1, wherein the metal convex portion forming step using the electroplating method is performed using a sulfite electrolyte solution.

5. The method of claim 1, wherein the top metallic layer remaining around the pixel array is formed in a closed-type, a streamlined-type or a straight-type.

6. The method of claim 1, wherein the lens has a groove which can be integrated with the metal convex portion.

* * * * *